United States Patent
Dirksen et al.

(10) Patent No.: US 10,008,958 B2
(45) Date of Patent: Jun. 26, 2018

(54) CAPACITIVE MICRO-MACHINED TRANSDUCER AND METHOD OF MANUFACTURING THE SAME

(71) Applicant: KONINKLIJKE PHILIPS N.V., Eindhoven (NL)

(72) Inventors: Peter Dirksen, Valkenswaard (NL); Ruediger Mauczok, Erkelenz (DE); Koray Karakaya, Eindhoven (NL); Johan Hendrik Klootwijk, Eindhoven (NL); Bout Marcelis, Eindhoven (NL); Marcel Mulder, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days. days.

(21) Appl. No.: 14/624,945

(22) Filed: Feb. 18, 2015

(65) Prior Publication Data

US 2015/0162852 A1    Jun. 11, 2015

Related U.S. Application Data

(63) Continuation of application No. 14/369,341, filed as application No. PCT/IB2013/050481 on Jan. 18, 2013, now Pat. No. 9,231,496.

(Continued)

(51) Int. Cl.
*H02N 11/00* (2006.01)
*H02N 1/00* (2006.01)
(Continued)

(52) U.S. Cl.
CPC .......... *H02N 1/006* (2013.01); *B06B 1/0292* (2013.01); *B81B 3/00* (2013.01); *B81C 1/00158* (2013.01);
(Continued)

(58) Field of Classification Search
CPC ............ B81C 1/00373; B81C 1/00158; H02N 1/006; H02N 1/08; B81B 3/00; B81B 2203/0127; B06B 1/0292
See application file for complete search history.

(56) References Cited

U.S. PATENT DOCUMENTS

| 6,885,056 | B1 | 4/2005 | Dornisch et al. |
| 7,037,746 | B1* | 5/2006 | Smith ............... B06B 1/0292 438/53 |

(Continued)

FOREIGN PATENT DOCUMENTS

| CN | 101262958 A | 9/2008 |
| CN | 101969856 A | 2/2011 |

(Continued)

OTHER PUBLICATIONS

"Current Tunnelling in MOS Devices With AlX03/SI02 Gate Dielectric" Bouazra et al, Research Letters in Physics, vol. 2008, p. 1-5.

(Continued)

*Primary Examiner* — Allen Parker
*Assistant Examiner* — Wasiul Haider

(57) ABSTRACT

The present invention relates to a method of manufacturing a capacitive micro-machined transducer (100), in particular a CMUT, the method comprising depositing a first electrode layer (10) on a substrate (1), depositing a first dielectric film (20) on the first electrode layer (10), depositing a sacrificial layer (30) on the first dielectric film (20), the sacrificial layer (30) being removable for forming a cavity (35) of the transducer, depositing a second dielectric film (40) on the sacrificial layer (30), and depositing a second electrode layer (50) on the second dielectric film (40), wherein the first dielectric film (20) and/or the second dielectric film (40) comprises a first layer comprising an oxide, a second layer comprising a high-k material, and a third layer comprising (Continued)

an oxide, and wherein the depositing steps are performed by Atomic Layer Deposition. The present invention further relates to a capacitive micro-machined transducer (100), in particular a CMUT, manufactured by such method.

12 Claims, 13 Drawing Sheets

Related U.S. Application Data

(60) Provisional application No. 61/591,344, filed on Jan. 27, 2012.

(51) Int. Cl.
*B06B 1/02* (2006.01)
*B81C 1/00* (2006.01)
*B81B 3/00* (2006.01)
*H02N 1/08* (2006.01)

(52) U.S. Cl.
CPC ........... *B81C 1/00373* (2013.01); *H02N 1/08* (2013.01); *B81B 2203/0127* (2013.01)

(56) References Cited

U.S. PATENT DOCUMENTS

| | | | |
|---|---|---|---|
| 7,790,490 B2 | 9/2010 | Caliano | |
| 7,923,795 B2 | 4/2011 | Kobayashi et al. | |
| 8,327,521 B2 | 12/2012 | Dirksen et al. | |
| 9,231,496 B2* | 1/2016 | Dirksen | B06B 1/0292 |
| 2005/0173759 A1* | 8/2005 | Kim | H01L 29/66621 |
| | | | 257/331 |
| 2006/0125879 A1 | 6/2006 | Fujii et al. | |
| 2007/0161896 A1* | 7/2007 | Adachi | B06B 1/0292 |
| | | | 600/437 |
| 2007/0164632 A1* | 7/2007 | Adachi | A61B 8/4483 |
| | | | 310/311 |
| 2008/0283945 A1 | 11/2008 | Kobayashi et al. | |
| 2009/0108708 A1* | 4/2009 | Jiang | B06B 1/0622 |
| | | | 310/334 |
| 2010/0202254 A1 | 8/2010 | Roest et al. | |
| 2010/0327380 A1* | 12/2010 | Chang | B06B 1/0292 |
| | | | 257/419 |
| 2011/0163630 A1* | 7/2011 | Klootwijk | B06B 1/0292 |
| | | | 310/300 |
| 2012/0021127 A1* | 1/2012 | Sato | C07F 7/025 |
| | | | 427/248.1 |
| 2013/0036827 A1* | 2/2013 | Besling | G01L 9/0045 |
| | | | 73/753 |
| 2013/0187236 A1* | 7/2013 | Xie | H01L 29/4966 |
| | | | 257/369 |
| 2013/0240871 A1* | 9/2013 | Shimoda | B41J 2/161 |
| | | | 257/43 |
| 2015/0021672 A1* | 1/2015 | Chuang | H01L 21/28088 |
| | | | 257/288 |

FOREIGN PATENT DOCUMENTS

| | | | | |
|---|---|---|---|---|
| WO | WO2009077961 | * | 6/2009 | ........... B06B 1/0292 |
| WO | 2010032156 A2 | | 3/2010 | |

OTHER PUBLICATIONS

"Atomic Layer Deposition of HF02 Thin Films and Nanolayered HF02—Al2O3—NB205 Dielectrics" Kukli et al, Journal of Materials Science: Materials in Electronics 14 (2003) p. 361-367.

"A Novel Method for Fabricating Capacitive Micromachined Ultrasonic Transducers With Ultra-Thin Membranes" Liu et a, 2004 IEEE Ultrasonics Symposium, IEEE Montreal, CA, vol. 1. Aug. 2004 p. 497-500.

"Atomic Layer Deposition for Fabricating Capacitive Micromachined Ultrasonic Transducers" Liu et al, Biomedical Imaging: IEEE International Symposium, Apr. 15-18, 2004, p. 512-515.

* cited by examiner

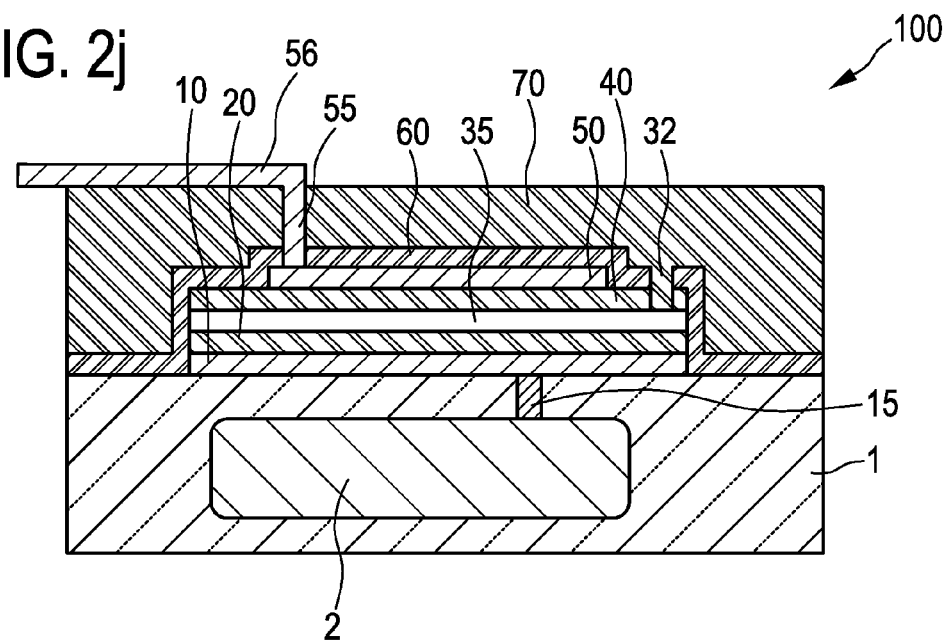

CAPACITIVE MICRO-MACHINED TRANSDUCER AND METHOD OF MANUFACTURING THE SAME

CROSS REFERENCE OF RELATED APPLICATIONS

This application is a continuation of U.S. application Ser. No. 14/369341 filed Jun. 27, 2014 which was the U.S. National Phase application under 35 U.S.C. § 371 of International Application No. PCT/IB2013/050481, filed on Jan. 18, 2013, which claims the benefit of U.S. Provisional Application No. 61/591,344 filed on Jan. 27, 2012. These applications are hereby incorporated by reference herein.

FIELD OF THE INVENTION

The present invention relates to a method of manufacturing a capacitive micro-machined transducer, in particular a capacitive micro-machined ultrasound transducer (CMUT) for transmitting and/or receiving ultrasound waves. The present invention further relates to a capacitive micro-machined transducer, in particular a capacitive micro-machined ultrasound transducer (CMUT) for transmitting and/or receiving ultrasound.

BACKGROUND OF THE INVENTION

The heart of any ultrasound (imaging) system is the transducer which converts electrical energy in acoustic energy and back. Traditionally, these transducers are made from piezoelectric crystals arranged in linear (1-D) transducer arrays, and operating at frequencies up to 10 MHz. However, the trend towards matrix (2-D) transducer arrays and the drive towards miniaturization to integrate ultrasound (imaging) functionality into catheters and guide wires has resulted in the development of so-called capacitive micro-machined ultrasound transducers (CMUT). A CMUT comprises a membrane (or diaphragm), a cavity underneath the membrane, and electrodes forming a capacitor. For receiving ultrasound waves, ultrasound waves cause the membrane to move or vibrate and the variation in capacitance between the electrodes can be detected. Thereby, the ultrasound waves are transformed into a corresponding electrical signal. Conversely, an electrical signal applied to the electrodes causes the membrane to move or vibrate and thereby transmitting ultrasound waves.

However, charging is a known disadvantage of capacitive micro-machined ultrasound transducer. WO 2010/032156 A2 describes a capacitive micro-machined ultrasound transducer with a specific layer structure which solves the charging problem. A first isolation layer comprising a dielectric is arranged between the first electrode and the second electrode. Further, a second isolation layer comprising a dielectric can be arranged between the second electrode and the cavity. Especially, a so-called ONO (Oxide-Nitride-Oxide) dielectric layer renders a solution to charging.

In WO 2010/032156 A2, the first dielectric isolation layer and the second dielectric isolation layer electrically isolate the first electrode and the second electrode. Such dielectric isolation layers determine to a fair extent the overall performance of the CMUT device. In the ideal case, dielectric isolation layers are very thin or have high dielectric constant and a high breakdown voltage. However, an ONO dielectric layer has its limitations and can be deposited only at relative thick layers (e.g. about 250 nm using PECVD) and a low dielectric constant, as the dielectric constant of nitride is about 5 to 7. Thus, the performance of the CMUT is limited by a minimum thickness of the ONO dielectric layer, the electrical breakdown voltage and its dielectric constant. A particular problem with such a CMUT device can be that the operating voltage is rather high and the output pressure relatively low. Therefore, there is a need to further improve such a CMUT.

SUMMARY OF THE INVENTION

It is an object of the present invention to provide an improved capacitive micro-machined transducer (in particular CMUT), in particular with improved performance (e.g. lowering the operating voltage and/or increasing the output pressure) and/or easier to manufacture. It is a further object of the present invention to provide an improved method of manufacturing such capacitive micro-machined transducer (in particular CMUT).

In a first aspect of the present invention, a method of manufacturing a capacitive micro-machined transducer, in particular a CMUT, is presented, the method comprising: depositing a first electrode layer on a substrate, depositing a first dielectric film on the first electrode layer, depositing a sacrificial layer on the first dielectric film, the sacrificial layer being removable for forming a cavity of the transducer, depositing a second dielectric film on the sacrificial layer, depositing a second electrode layer on the second dielectric film, wherein the first dielectric film and/or the second dielectric film comprises a first layer comprising an oxide, a second layer comprising a high-k material, and a third layer comprising an oxide, and wherein the depositing steps are performed by Atomic Layer Deposition.

In a further aspect of the present invention, a capacitive micro-machined transducer, in particular a CMUT, manufactured by the method of the present invention is presented.

In a further aspect of the present invention, a capacitive micro-machined transducer, in particular a CMUT, is presented, comprising: a first electrode layer on a substrate, a first dielectric film on the first electrode layer, a cavity formed above the first dielectric film, a second dielectric film covering the cavity, and a second electrode layer on the second dielectric film, wherein the first dielectric film and/or the second dielectric film comprises a first layer comprising an oxide, a second layer comprising a high-k material, and a third layer comprising an oxide.

The basic idea of the invention is to provide a use a dielectric isolation layer comprising an oxide layer (O), a high-k layer, and another oxide layer (O). In other words, a high-k layer is sandwiched between two oxide layers (in particular silicone oxide). This is a so-called laminate. High-k refers to a high dielectric constant (e.g. 8 or more). The dielectric constant is commonly abbreviated by the letter k (or also $\epsilon_r$). Compared to an ONO dielectric isolation layer, the transducer performance can be significantly improved (e.g. more output pressure at a lower operating voltage) in this way. Thus, by replacing an ONO dielectric isolation layer by a high-k material deposited by Atomic Layer Deposition (ALD), a significant increase in CMUT performance in terms of operating voltage and output pressure. Further, a similar performance with respect to the stability of the device (in particular stable output versus time) can be achieved, compared to an ONO dielectric isolation layer. In other words, the laminate does not store electrical charges that cause the ultrasound output to drift.

The present invention uses Atomic Layer Deposition (ALD) for the manufacturing method. The ALD technique provides advantages and options to overcome the current processing limitations and, accordingly, the CMUT performance limitations. A manufacturing method is provided in which all CMUT functional layers (AL-ALD CMUT) are deposited in one single process sequence, in particular under a controlled environment without exposing the substrate to the ambient environment as would be necessary during prior art processing in general. The CMUT functional layers are in particular the first electrode layer (providing the first electrode), the first dielectric film (providing electrical insulation), the sacrificial layer (forming the cavity), the second dielectric film (providing electrical insulation), and the second electrode film (providing the second electrode). This process is also called the All Layer ALD (AL-ALD) CMUT process. In this way a wafer with a stack of deposited layers (or films) is achieved. As the wafer does not leave the ALD machine when growing the stack of layers, very clean material interfaces can be achieved. Further, performance improvement may be obtained by controlling and fine-tuning, for example the stress and charging properties, of the individual layers and the interfaces.

Atomic Layer Deposition is a thin film deposition technique that is based on the sequential use of a gas phase chemical process. The majority of ALD reactions use two chemicals, typically called "precursors". These precursors react with a surface one-at-a-time in a sequential manner. By exposing the precursors to the growth surface repeatedly, a thin film is deposited. ALD is a self-limiting (i.e. the amount of the thin material deposited in each reaction cycle is constant), sequential surface chemistry that deposits conformal thin-films of materials onto substrates of varying compositions. ALD deposited layers generally are amorphous. ALD deposited layers generally have a high quality, are pinhole free and can be deposited at low temperatures. Due to the low process temperature ALD is CMOS compatible. In particular, by using ALD (e.g. an ALD-tool) very thin layers can be deposited (e.g. well below 100 nm) and pinhole free. A thinner dielectric isolation layer results in more output pressure at a lower operating voltage and improved receive sensitivity. This is because the membrane is attracted by an electrical force between the electrodes in a direction towards the bottom of the cavity. A thin dielectric film or a material having a high dielectric constant (also called high-epsilon material or high-k material) increases this electrical force significantly, which generates more output power or increases the receive sensitivity (based on Coulomb's inverse-square law). This in particular holds for a CMUT operated in collapsed mode (i.e. the membrane partly touches the bottom of the cavity during operation, e.g. by applying a bias voltage between the electrodes), but in general also for a CMUT in the non-collapsed mode.

Preferred embodiments of the invention are defined in the dependent claims. It shall be understood that the claimed CMUT has similar and/or identical preferred embodiments as the claimed method and as defined in the dependent claims. In the same way, it shall be understood that the claimed method has similar and/or identical preferred embodiments as the claimed method and as defined in the dependent claims.

In an embodiment, the high-k material is Aluminium Oxide ($Al_2O_3$) and/or Hafnium Oxide ($HfO_2$). Aluminium Oxide (k or $\epsilon_r$ between 7 and 9, in particular about 8 or 9) or Hafnium Oxide (k or $\epsilon_r$ between 12 and 27, in particular about 14 or 20) has a high dielectric constant. In one example, a laminate (alternating layers) of Oxide—Aluminium Oxide—Oxide (abbreviated by OAO) can be provided in this way. In another example, a laminate (alternating layers) of Oxide—Hafnium Oxide—Oxide (abbreviated by OHO) can be provided in this way.

In another embodiment, the second layer comprises a first sublayer comprising Aluminum Oxide, a second sublayer comprising Hafnium Oxide, and a third sublayer comprising Aluminium Oxide. In this way, a laminate (alternating layers) of Oxide—Aluminium Oxide—Hafnium Oxide—Aluminium Oxide—Oxide (abbreviated by OAHAO) can be provided. Aluminium Oxide (also referred to as Alumina) has a high dielectric constant combined with a high electrical breakdown voltage. Hafnium Oxide has an even higher dielectric constant but a low breakdown voltage. Therefore, an OAHAO dielectric isolation layer combines low stress, a high dielectric constant and a high breakdown voltage.

In another embodiment, the second layer has a thickness below 100 nm. In this way a very thin high-k layer can be provided, in particular using ALD.

In a further embodiment, the method further comprises patterning at least one of the deposited layers and films. In particular, most of or all of the deposited layers and films can be patterned. In this way, the manufacturing method can use "top-to-bottom" patterning. The top-to-bottom patterning provides a CMUT with a characteristic pyramid structure, in particular step pyramid structure. This typical cross section can be identified via analyzing methods using, for example, a FIB or SEM (Scanning Electron Microscope) cross section. Patterning means bringing the structure (e.g. stack of deposited layers) into a pattern. This can for example be performed using (photo) lithography where a photo sensitive is exposed. The exposure tool is called a Stepper. A photo sensitive layer, called a Resist, is developed. The pattern can be etched into a layer. The etching process can be a "wet" or "dry" process.

In a variant of this embodiment, patterning comprises a step of patterning the second electrode layer. In this way, the lateral dimension of the second electrode can be defined. For example, the second electrode layer can be patterned to be smaller than the first electrode layer. In this way, "top-to-bottom" patterning is performed (e.g. using a first etching mask). A characteristic pyramid structure, in particular step pyramid structure, is thus provided.

In another variant of this embodiment, patterning comprises a step of patterning the sacrificial layer and/or the first electrode layer. By patterning the sacrificial layer, the lateral dimension of the cavity can be defined. The "top-to-bottom" patterning is further performed (e.g. using a second etching mask) in this way. The patterning of the sacrificial layer can be performed in a step separate from the step of patterning the second electrode layer. Alternatively, the patterning of the sacrificial layer and the patterning of the second electrode layer can be performed in a common step. By patterning the first electrode layer, the lateral dimension of the first electrode can be defined. The "top-to-bottom" patterning is further performed (e.g. using a third etching mask) in this way. The patterning of the first electrode layer can be performed in a step separate from the step of patterning the second electrode layer and/or the step of patterning the sacrificial layer. Alternatively, the patterning of the first electrode layer and the patterning of the sacrificial layer can be performed in a common step. This can also be performed in a common step with patterning of the second electrode layer.

In another embodiment or variant, most of or all the deposited layers and films are patterned. In particular, most of or all of the layers and films deposited by ALD are patterned after the ALD deposition. In particular, all of the CMUT functional layers are patterned. More particularly, the first electrode layer, the first dielectric film, the sacrificial layer, the second dielectric film, and the second electrode layer are patterned. This patterning can comprise multiple steps, for example a first step of patterning the top most layer(s) and a second step of patterning the bottom most layer(s). In each step the layers can be patterned to have a different lateral dimension (in a direction parallel to the top surface(s) of the layers). In this way, a (step) pyramid structure can be created. Alternatively, patterning can be performed in a single step in which the layers are patterned to have the same lateral dimension.

In another embodiment, the method further comprises depositing a dielectric layer covering the deposited layers and films. This depositing step can in particular be performed using Atomic Layer Deposition. The dielectric layer can in particular cover top surfaces and side surfaces of the deposited layers and films with essentially the same coverage. This provides a very good step coverage, in particular by Atomic Layer Deposition.

In another embodiment, the method further comprises removing the sacrificial layer by providing an etch hole and etching the sacrificial layer for forming the cavity. In this way, the cavity of the CMUT is provided (e.g. using a fourth etching mask) in an easy manner.

In another embodiment, the first dielectric film and/or the second dielectric film comprises process residuals, such as Carbon or Chlorine residuals. These residuals may be remainders of the pre-cursor(s) used in the ALD process. This shows that the CMUT has been manufactured using Atomic Layer Deposition. The residuals can for example be detected using XPS (X-ray photoelectron spectroscopy) or other characterization methods, such as SIMS (Secondary Ion Mass spectroscopy).

In another embodiment, the first electrode layer and/or the second electrode layer comprises a non-metal conductive material. In this way the Atomic Layer Deposition technique can provide the unique option to deposit all functional layers of the CMUT during one single process sequence. The non-metal conductive material can for example be a semiconductor.

In a variant of this embodiment, the non-metal conductive material is at least one material selected from the group comprising TiN (Titanium Nitride), TaN (Tantalum Nitride), TaCN, $IrO_2$ (Iridium Oxide), ITO (Indium Tin Oxide), $LaNiO_3$, and $SrRuO_3$ (Strontium Ruthenate). These materials are suitable for Atomic Layer Deposition. In a variant of this variant, the non-metal conductive material is TiN (Titanium Nitride). Titanium-Nitride is particularly suitable, in particular for Atomic Layer Deposition. For example, Titanium-Nitride has a low electrical resistance (e.g. compared to polysilicone) and/or can be deposited as a very thin layer (e.g. compared to polysilicone).

In an alternative embodiment, the first electrode layer and/or the second electrode layer comprises a metal conductive material. In particular, the metal conductive material can comprise at least one material selected from the group comprising Ni (Nickel), Copper (Cu), W (Tungsten), Pt (Platinum), Ir (Iridium), and Al (Aluminium). For example, the metal can be an alloy thereof.

In another embodiment, the at least one patterned layer and/or film ends abruptly or non-continuously at its sides. In other words, the top surface and the side surface of a layer are substantially orthogonal to each other. This shows that the CMUT has been manufactured using patterning. Ideally, the top surface and the side surface of a layer are orthogonal (90°) or at a right angle to each other. However, in reality the layer has some slope due to the patterning (in particular etching) process not being perfect, or deliberately a slope may be applied. Also the etching rates of the various materials are not equal. Thus, when patterning (in particular etching) a stack of layers with different properties, the top surface and the side surface of the layer at its end will no be a perfect right angle. An overhanging structure can for example be created. Thus, substantially orthogonal can be understood to be an angle between 70° and 110° (90°±20°), or between 80° and 100° (90°±10°), or between 85° and 95° (90°±5°).

In another embodiment, the CMUT further comprises a dielectric layer covering the deposited layers and films. In particular, the dielectric layer covers top surfaces and side surfaces of the deposited layers and films with essentially the same coverage. This shows that the CMUT provides a very good step coverage, in particular using Atomic Layer Deposition. In particular, vertical portions of the dielectric layer can extend substantially orthogonal to the deposited layers and/or films. As explained above, substantially orthogonal can be understood to be an angle between 70° and 110° (90°±20°), or between 80° and 100° (90°±10°), or between 85° and 95° (90°±5°).

In another embodiment, the second electrode layer is patterned to be smaller than the first electrode layer. This shows that the CMUT has been manufactured using "top-to-bottom" patterning. A characteristic pyramid structure, in particular step pyramid structure, is thus provided.

In another embodiment, the CMUT further comprises at least one conductive via extending from the first electrode layer and/or the second electrode layer in a direction orthogonal to the top surfaces of the layers. Thus, the conductive via is orthogonal or at a right angle to the deposited layers. In this way the first electrode, the second electrode, or both, can be provided with an electrical connection. For example, the conductive via may be electrically connected to an ASIC underneath the CMUT.

BRIEF DESCRIPTION OF THE DRAWINGS

These and other aspects of the invention will be apparent from and elucidated with reference to the embodiment(s) described hereinafter. In the following drawings

FIG. 1j shows a schematic cross section of a CMUT according to a first embodiment;

FIG. 2a-j show a manufacturing method of a CMUT according to a second embodiment;

FIG. 2j shows a cross section of a CMUT according to a second embodiment;

FIG. 3h shows a schematic cross section of a CMUT according to a third embodiment;

DETAILED DESCRIPTION OF THE INVENTION

FIG. 1a-j show a method of manufacturing a CMUT 100 according to a first embodiment. In particular, FIG. 1b-j show a schematic top to bottom process flow, after all functional CMUT layers have been deposited in one process sequence (see FIG. 1a) by using Atomic Layer Deposition (ALD).

Figure 1A:
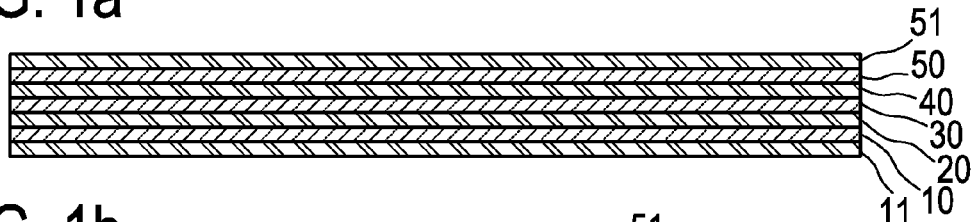
FIG. 1a-j show a method of manufacturing a CMUT according to a first embodiment.

The method starts with the process sequence of using ALD (see FIG. 1a). First, a first electrode layer 10 is deposited on a substrate (not shown) or dielectric layer 11. In the embodiment shown in FIG. 1a, the dielectric layer 11 is provided or deposited between the substrate and the first electrode layer 10. Dielectric layer 11 is in this case the first layer on the substrate. In this case, the dielectric layer can for example be made of (Silicon) Oxide or (Silicon) Nitride, in particular when processing on an ASIC, where often a planarization step is used to create a smooth surface. However, dielectric layer 11 could also be omitted. Then, a first dielectric film 20 is deposited on the first electrode layer 10, and a sacrificial layer 30 is deposited on the first dielectric film 30. The sacrificial layer 30 is removable for forming a cavity of the transducer later on. Subsequently, a second dielectric film 40 is deposited on the sacrificial layer 30. Then, a second electrode layer 50 is deposited on the second dielectric film 40. In the embodiment of FIG. 1a, an additional dielectric layer 51 is deposited on the second electrode layer 50. Dielectric layer 51 covers or protects the second electrode layer 40, in particular when a sacrificial etch to remove sacrificial layer 30 is performed. However, dielectric layer 51 could also be omitted. Each of these depositing steps described above is performed by Atomic Layer Deposition (ALD). In this way a stack of alternating layers of a dielectric material and a conductive material are provided (see FIG. 1a). Thus, all CMUT functional layers (AL-ALD CMUT) are deposited in one single process sequence, i.e. a single run in the ALD machine where the wafer does not leave the machine but several (process or deposition) steps may take place. Thus, various materials can be stacked on top of each other in one process sequence, but one material after another is deposited in various (process or deposition) steps within this process sequence. This process or process sequence is also called the All Layer ALD (AL-ALD) CMUT process.

The method further comprises patterning at least one of the deposited layers and films 10, 20, 30, 40, 50, 51. An example of such patterning will be explained with reference to FIG. 1b-d. The manufacturing method uses "top-to-bottom" patterning. The top-to-bottom patterning provides a CMUT with a characteristic pyramid structure, in particular step pyramid structure, (which typical cross section can, for example, be identified via analyzing methods that make use of a FIB or SEM cross section). The at least one patterned layer and/or film ends abruptly or non-continuously at its sides. In other words, the top surface and the side surface of a layer are substantially orthogonal to each other. This shows that the CMUT has been manufactured using patterning. Ideally, the top surface and the side surface of a layer are orthogonal(90° )to each other. However, in reality the layer has some slope due to the patterning (in particular etching) process not being perfect, or deliberately a slope may be applied. Also the etching rates of the various materials are not equal. Thus, when patterning (in particular etching) a stack of layers with different properties, the top surface and the side surface of the layer at its end will no be a perfect right angle. An overhanging structure can for example be created. Thus, substantially orthogonal can be understood to be an angle between 70° and 110° (90°±20°), or between 80° and 100° (90°±10°), or between 85° and 95° (90°±5°).

Figure 1B:
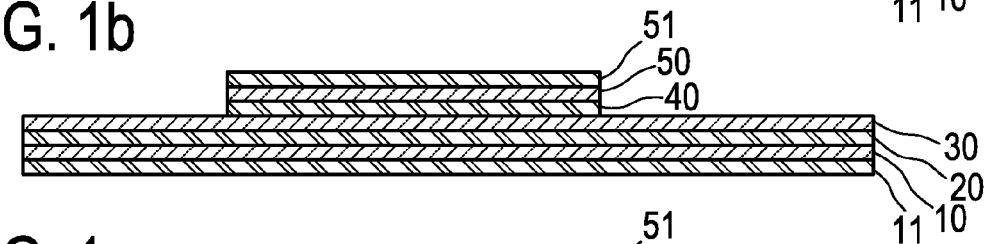
Figure 1C:
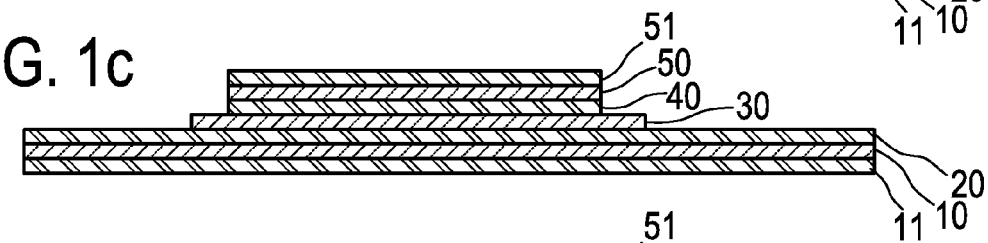
Figure 1D:
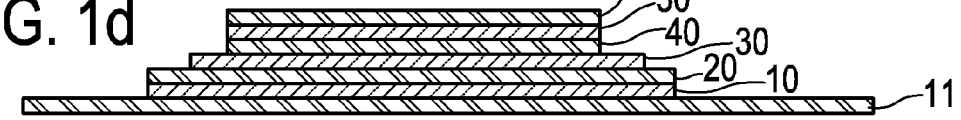

In this first embodiment, as can be seen in FIG. 1b, patterning comprises a first step of patterning the second electrode layer 50. This is performed using a first etching mask (labelled with "mask 1"). In this way, the lateral dimension (in a direction parallel to the top surfaces of the layers or to the top surface of the substrate) or length of the second electrode 50 is defined. In this example, in the first step of patterning also the second dielectric film 40 is patterned (as well as the additional dielectric layer 51 on the second electrode layer 50). As can be seen, the second electrode layer 50 is patterned to be smaller than the first electrode layer 10. For example, the second electrode layer 50 can be patterned in form of a ring electrode. This is beneficial for the acoustical performance. Patterning further comprises a second (separate) step of patterning the sacrificial layer 30, as indicated in FIG. 1c. This is performed using a second etching mask (labelled with "mask 2"). In this way, the lateral dimension (in a direction parallel to the top surfaces of the layers or to the top surface of the substrate) or length of the cavity of the CMUT can be defined. Furthermore, as shown in FIG. 1d, patterning comprises a third (separate) step of patterning the first electrode layer 10. This is performed using a third etching mask (labelled with "mask 3"). In this way, the lateral dimension (in a direction parallel to the top surfaces of the layers or to the top surface of the substrate) or length of the first electrode 30 is defined. In this example, in the third step of patterning also the first dielectric film 20 is patterned. Only the dielectric layer 11 on the substrate is not patterned in this example. Thus, most of the deposited layers and films (except for the dielectric layer 11) are now patterned. Now, the step of patterning after the ALD deposition is finished. All the deposited functional CMUT layers and films 10, 20, 30, 40, 50, 51 are now patterned.

Figure 1E:
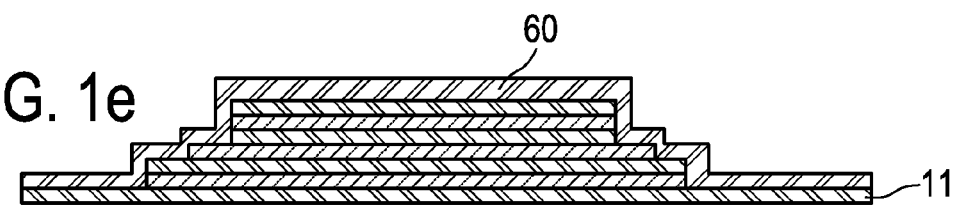
Figure 1F:
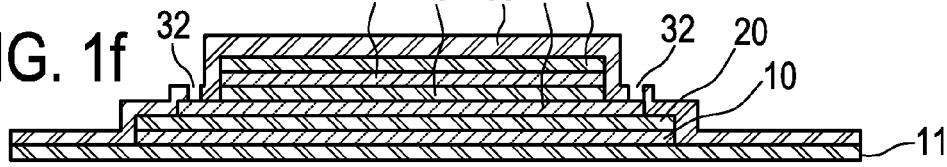

In a subsequent step, referring now to FIG. 1e, the method comprises depositing a dielectric layer 60 covering the deposited layers and films 10, 20, 30, 40, 50, 51. This depositing step can again be performed using Atomic Layer Deposition (ALD). Alternatively, another technique, such as PECVD, can be used. The dielectric layer 60 covers the top surfaces and side surfaces of the deposited layers and films 10, 20, 30, 40, 50, 51 with essentially the same coverage (e.g. the thickness of horizontal portion of the dielectric layer 60 and the thickness of the vertical portion of the dielectric layer 60 are essentially the same). In this way, a very good step coverage is provided. In other words, the vertical portions of the dielectric layer 60 and the horizontal portions of the dielectric layer 60 have about the same coverage or thickness (see FIG. 1e). The vertical portions (in a direction orthogonal to the top surfaces of the layers or to the top surface of the substrate) of the dielectric layer 60 extend substantially orthogonal to the deposited layers and films 10, 20, 30, 40, 50, 51. Ideally, the vertical portions of the dielectric layer 60 are orthogonal(90° )or at a right angle to the deposited layers and/or films. However, in reality the dielectric layer 60 has some slope. Therefore, the vertical portions of the dielectric layer 60 will not be will at a perfect right angle. Thus, substantially orthogonal can be understood to be an angle between 70° and 110° (90°±20°), or between 80° and 100° (90°±10°), or between 85° and 95° (90°±5°).

Figure 1G:
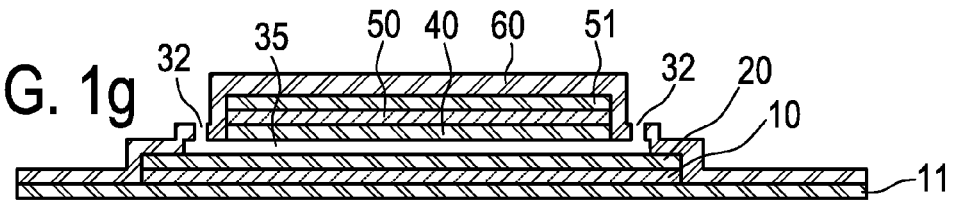
Figure 1H:
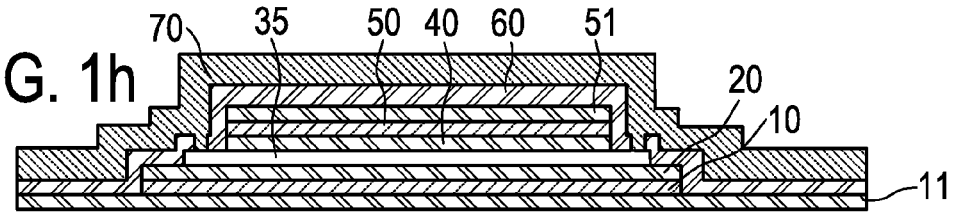
Figure 1I:
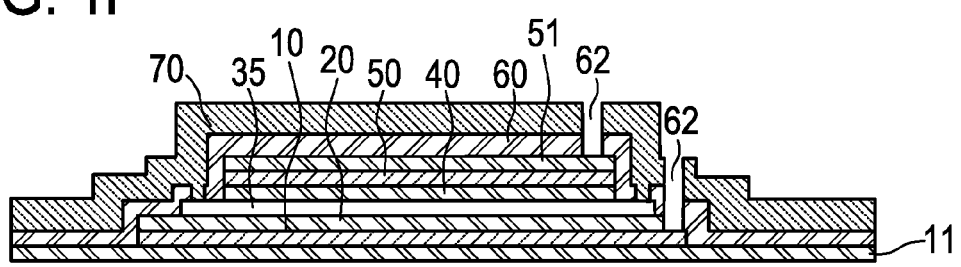

Subsequently, the method comprises removing the sacrificial layer 30 by providing an etch hole 32 (see FIG. 1f), in particular multiple etch holes (e.g. three or more), and etching the sacrificial layer 30 for forming the cavity 35 (see FIG. 1g). Providing the etch hole 32 is performed using a fourth etching mask (labelled with "mask 4"). The etch hole 32 is provided in the dielectric layer 60. The height (in a direction orthogonal to the top surfaces of the layers or to the top surface of the substrate) of the cavity is defined by the thickness of the sacrificial layer 30 that is removed. Then, referring to FIG. 1h, an additional layer 70, in particular an additional dielectric layer, can be provided covering the dielectric layer 60. The additional layer 70 closes or seals the etch holes 32.

Further, the method comprises providing at least one conductive via 15, 55 extending from the first electrode layer 10 and the second electrode layer 50, respectively, in a direction orthogonal to the top surfaces of the layers (or the top surface of the substrate). Thus, the conductive via 15, 55 is orthogonal or at a right angle to the deposited layers. In this example, this is performed by providing an etch hole 62 and filling the etch hole 62 with a conductive material for forming the conductive via 15, 55. Here, a first etch hole 62 is provided leading to the first electrode layer 10 (through the additional layer 70, the dielectric layer 60 and the first dielectric film 20). A second etch hole 62 is provided leading to the second electrode layer 50 (through the dielectric layer 60 and the additional layer 70). The first etch hole 62 is filled with the conductive material for forming the via 15 from the first electrode layer 10. The second etch hole 62 is filled with the conductive material for forming the via 55 from the second electrode layer 50. Further, a conductive portion 16, 56 for providing an external electrical connection (e.g. to an ASIC and/or a power supply, e.g. to connect to a bias voltage, or connections to a cable or wire bonds) from the via 15, 55, respectively, is provided. In this way, both the first electrode 10 and the second electrode 50 are provided with an electrical connection (e.g. to an ASIC underneath the CMUT). It will be understood that also only the first etch hole or the second etch hole can be provided. For example, the conductive via 15 from the first electrode 10 could also be formed in the substrate.

Figure 1J:
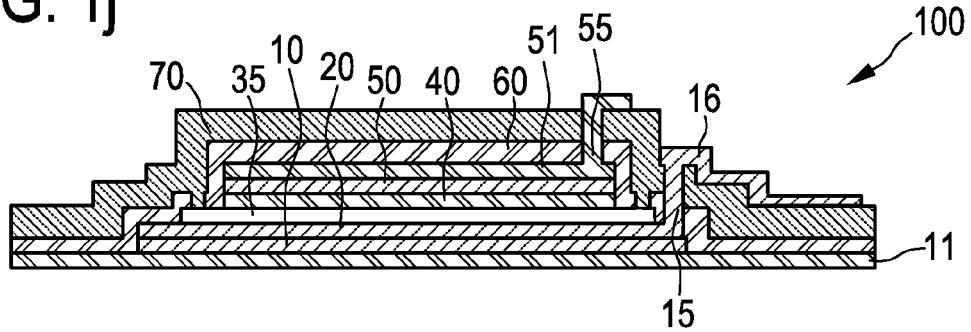

FIG. 1j shows a schematic cross section of a CMUT 100 according to a first embodiment. The CMUT 100 of FIG. 1j has in particular been manufactured using the method as described above with reference to FIG. 1. The CMUT 100 comprises the first (bottom) electrode layer 10 on the substrate (not shown), the first dielectric film 20 on the first electrode layer 10, the cavity 35 formed above the first dielectric film 20, the second dielectric film 40 covering the cavity 35, and the second (top) electrode layer 50 on the second dielectric film 40. Optionally, the CMUT 100 may comprise the dielectric layer 11 and the dielectric layer 51. Most of the deposited layers and films are patterned. In this embodiment, all the deposited CMUT functional layers and films 10, 20, 30, 40, 50 are patterned. Thus, each of the deposited CMUT functional layers and films 10, 20, 30, 40, 50 is patterned. The second electrode layer 50 is patterned to be smaller than the first electrode layer 10 (e.g. patterned in form of a ring electrode), which is beneficial for the acoustical performance. The second electrode layer 50 is patterned to be smaller than the cavity 35. The cavity 35 is patterned to be smaller than the first electrode layer 10. In this way the characteristic (step) pyramid structure is provided. The CMUT 100 further comprises the dielectric layer 60 covering the deposited layers and films 10, 20, 30, 40, 50. The dielectric layer 60 covers the top surfaces and side surfaces of the deposited layers and films 10, 20, 30, 40, 50 with essentially the same coverage or thickness, as explained above. The vertical portions of the dielectric layer 60 extend substantially orthogonal to the deposited layers 10, 20, 30, 40, 50. The CMUT 100 further comprises the additional layer 70 covering the dielectric layer 60. In particular, the additional layer 70 is much thicker compared to the other layers or films for example more than 2 times or more, or more than 5 times or more (e.g. a thickness of layer 40 of about 200 nm compared to a thickness of layer 70 of about 1 μm). Furthermore, the CMUT comprises the conductive via 15 extending from the first electrode layer 10 in the direction orthogonal to the top surfaces of the layers (vertical direction in FIG. 1j). Also, the CMUT 100 comprises the conductive via 55 extending from the second electrode layer 50 in the direction orthogonal to the top surfaces of the layers (vertical direction in FIG. 1j). The CMUT 100 further comprises a conductive portion 16, 56 for providing an external electrical connection (e.g. to an ASIC and/or a power supply, e.g. to connect to a bias voltage, or connections to a cable or wire bonds) from the via 15, 55, respectively. The via 15, 55 extends in a vertical direction (orthogonal to the top surface(s) of the layers or the substrate) and the conductive portion 56 extends in a horizontal direction (parallel to the top surfaces(s) of the layers or the substrate).

FIG. 2a-j show a manufacturing method of a CMUT according to a second embodiment. In this embodiment, a substrate 1 comprises an ASIC 2 integrated therein and a conductive via 15 in the substrate. Alternatively, the ASIC 2 could also be attached to the substrate 1. The method starts with depositing a first electrode layer 10 on the substrate 1. Then, a first dielectric film 20 is deposited on the first electrode layer 10, and a sacrificial layer 30 is deposited on the first dielectric film 20. The sacrificial layer 30 is removable for forming a cavity of the transducer later on. Subsequently, a second dielectric film 40 is deposited on the sacrificial layer 30. Then, a second electrode layer 50 is deposited on the second dielectric film 40. Each of these depositing steps is performed by Atomic Layer Deposition (ALD). In this way a stack of alternating layers of a dielectric material and a conductive material are provided (see FIG. 2b). Thus, all CMUT functional layers (AL-ALD CMUT) are deposited in one single process sequence.

The method further comprises patterning all of the deposited layers and films 10, 20, 30, 40, 50, in particular all of the deposited CMUT functional layers 10, 20, 30, 40, 50. In this embodiment, patterning comprises a first step of patterning the second electrode layer 50 (see FIG. 2c) and a second (separate) step of patterning the sacrificial layer 30 and the first electrode layer 10 as well as the first dielectric film 20 and the second dielectric film 40 (see FIG. 2d). Thus, in this embodiment, the sacrificial layer 30 and the first electrode layer 10 are patterned in a common step. The first step of patterning the second electrode layer 50 performed using a first etching mask (mask 1). The second patterning step can be performed using a second etching mask (mask 2). As can be seen, the second electrode layer 50 is patterned to be smaller than the first electrode layer 10 (e.g. in form of a ring electrode). Now, the step of patterning is finished.

Figure 2A:
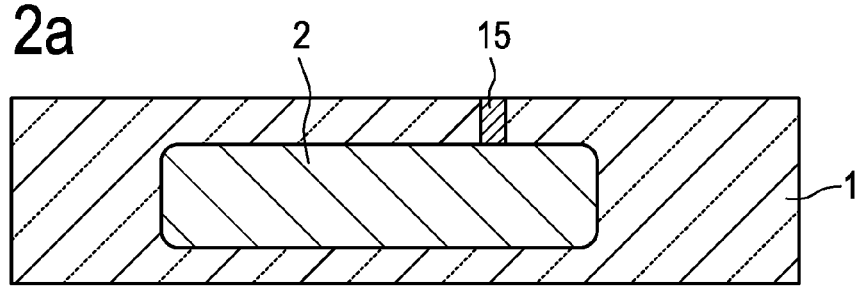
Figure 2B:
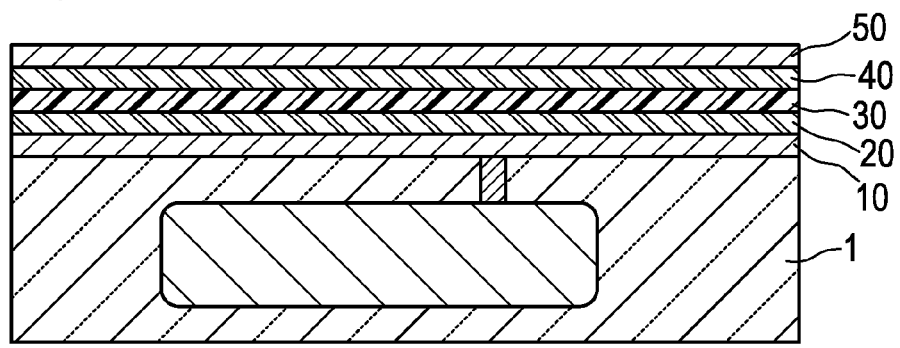
Figure 2C:
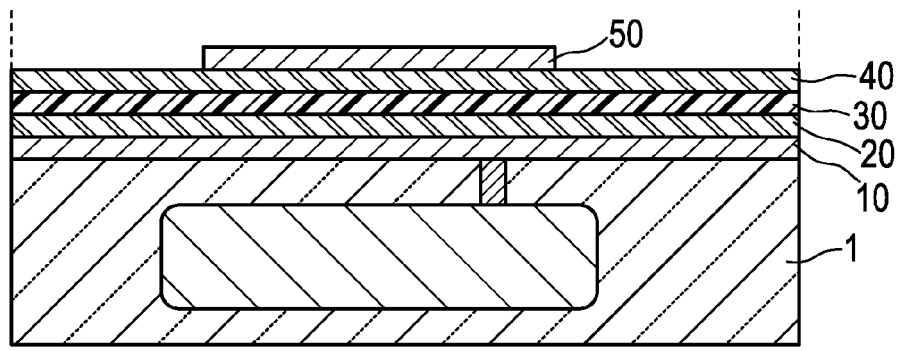
Figure 2D:
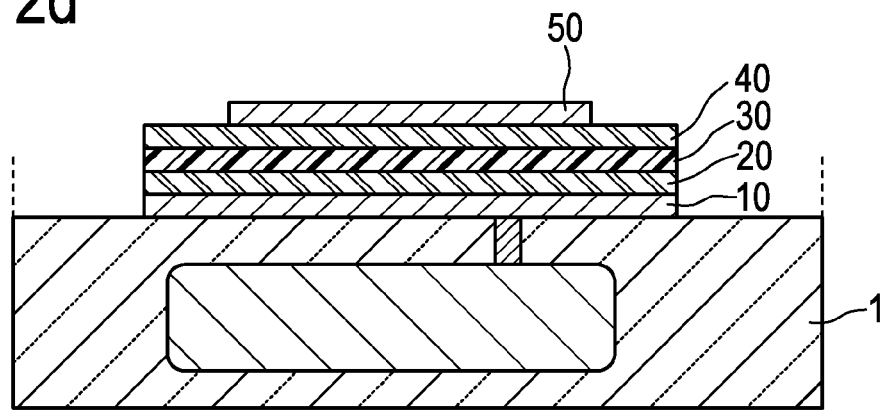
Figure 2E:
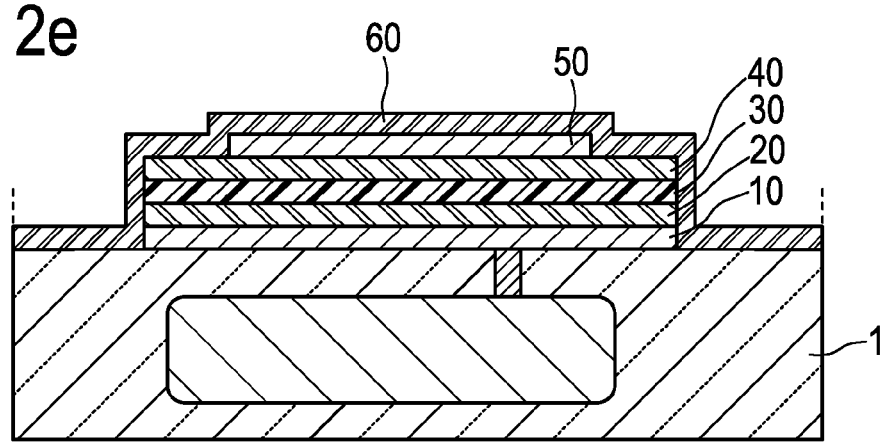
Figure 2F:
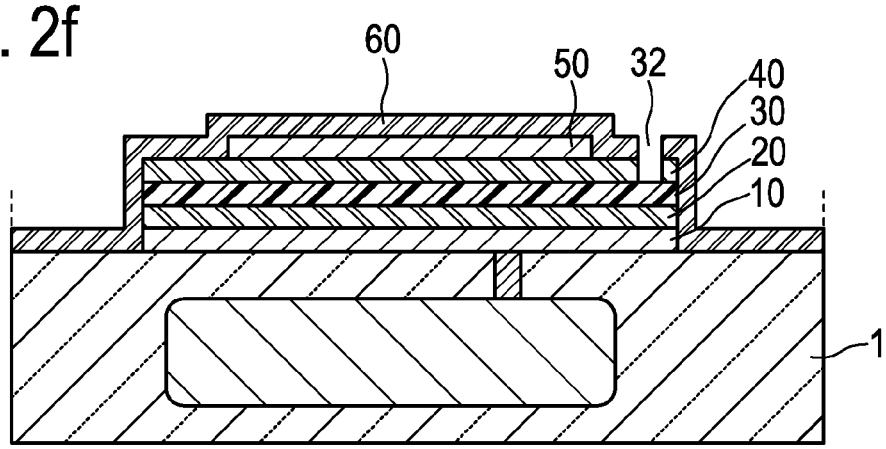

In a subsequent step, referring now to FIG. 2e, the method comprises depositing a dielectric layer 60 covering the deposited layers and films 10, 20, 30, 40, 50. This depositing step is again performed using Atomic Layer Deposition (ALD). The dielectric layer 60 covers the top surfaces and side surfaces of the deposited layers and films 10, 20, 30, 40, 50 with essentially the same coverage or thickness, as explained above. In this way, a very good step coverage is provided. In other words, the vertical portions of the dielectric layer 60 and the horizontal portions of the dielectric layer 60 have about the same coverage or thickness (see FIG. 2e). The vertical portions of the dielectric layer 60 extend substantially orthogonal to the deposited layers 10, 20, 30, 40, 50.

Figure 2G:
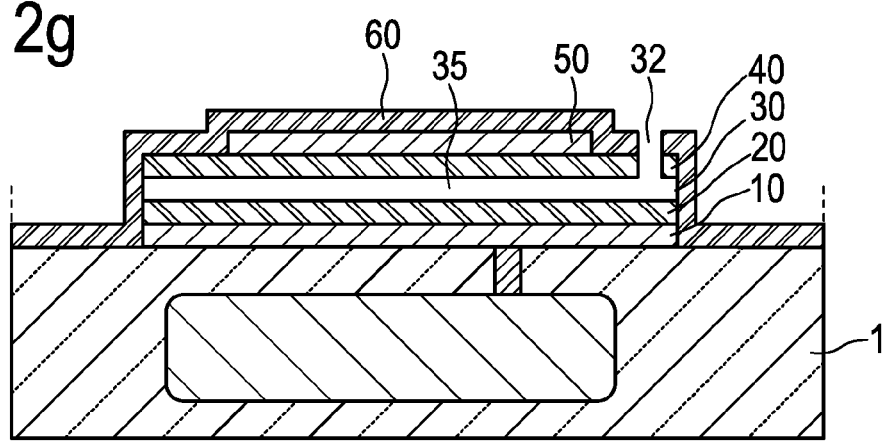
Figure 2H:
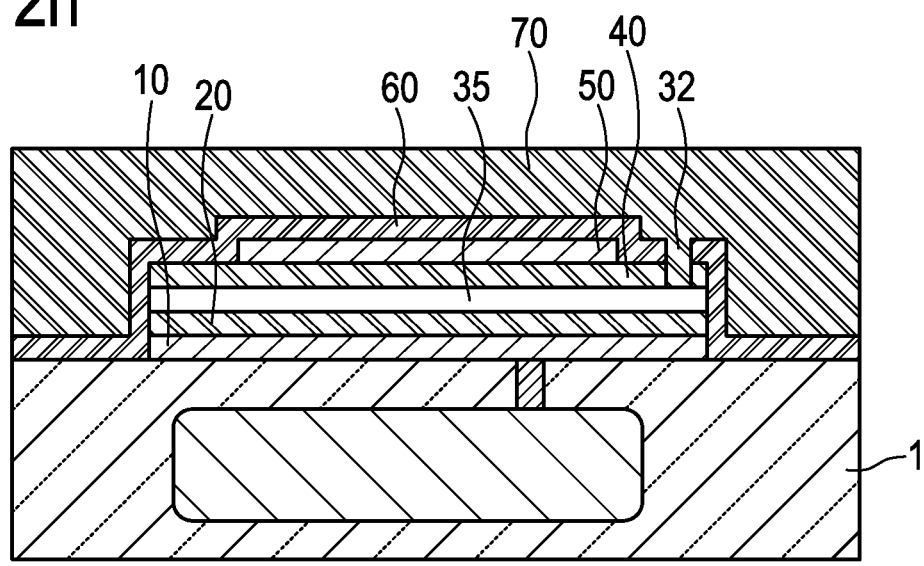
Figure 2I:
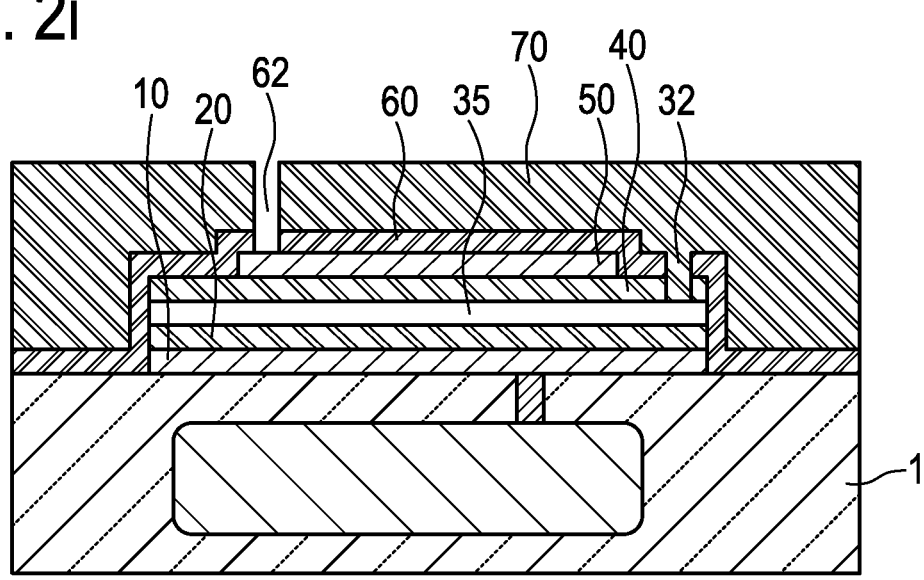

Subsequently, the method comprises removing the sacrificial layer 30 by providing an etch hole 32 (see FIG. 2f) and etching the sacrificial layer 30 for forming the cavity 35 (see FIG. 2g). The etch hole 32 is provided in the dielectric layer 60 and the second dielectric isolation film 40. The etch hole 32 can be provided using a third etching mask (mask 3). Then, referring to FIG. 2h, an additional layer 70, in particular an additional dielectric layer, can be provided covering the dielectric layer 60. The additional layer 70 closes or seals the etch hole 32.

Further, the method comprises providing a conductive via 55 extending from the second electrode layer 50 in a direction orthogonal to the top surfaces of the layers. Thus, the conductive via 55 is orthogonal or at a right angle to the deposited layers. In this example, this is performed by providing an etch hole 62 (see FIG. 2i) and filling the etch hole 62 with a conductive material for forming the conductive via 55 (see FIG. 2j). Providing the etch hole 62 can be performed using a fourth etching mask (mask 4). The conductive via 15 to the first electrode 10 is formed in the substrate 1. Further, a conductive portion 56 for providing an external electrical connection from the via 55 is provided. This can be performed by depositing a conductive layer on the additional layer 70 and then patterning the conductive layer. This can be performed using a fifth etching mask (mask 5).

FIG. 2j shows a cross section of a CMUT 100 according to a second embodiment. The CMUT 100 of FIG. 2j has in particular been manufactured using the method as described above with reference to FIG. 2. The CMUT 100 comprises the first electrode layer 10 on the substrate 1, the first dielectric film 20 on the first electrode layer 10, the cavity 35 formed above the first dielectric film 20, the second dielectric film 30 covering the cavity 35, and the second electrode layer 50 on the second dielectric film 40. Optionally, the CMUT 100 may comprise a dielectric layer 11 on the substrate and a dielectric layer 51 on the second electrode layer 50, as explained with reference to the first embodiment. In the embodiment shown in FIG. 2j, all of the deposited CMUT functional layers and films 10, 20, 30, 40, 50 are patterned. The second electrode layer 50 is patterned to be smaller or to have a smaller lateral dimension (in a direction parallel to the top surface(s) of the layers or substrate), for example smaller diameter in the case of a circular shape, than the first electrode layer 10 and the cavity 35. In this way, the characteristic (step) pyramid structure is provided. The CMUT 100 further comprises the dielectric layer 60 covering the deposited layers and films 10, 20, 30, 40, 50. The dielectric layer 60 covers the top surfaces and side surfaces of the deposited layers and films 10, 20, 30, 40, 50 with essentially the same coverage, as explained above. The vertical portions of the dielectric layer 60 extend substantially orthogonal to the deposited layers 10, 20, 30, 40, 50. The CMUT 100 further comprises the additional layer 70 covering the dielectric layer 60. In particular, the additional layer 70 is much thicker compared to the other layers or films for example more than 2 times or more, or more than 5 times or more (e.g. a thickness of layer 40 of about 200 nm compared to a thickness of layer 70 of about 1 μm). It should be noted that in FIG. 2j, the additional layer 70 is indicated only schematically, and that it can rather follow the shape of layer 60, similarly to the additional layer 70 illustrated with respect to FIG. 1j. Furthermore, the CMUT comprises the conductive via 55 extending from the second electrode layer 50 in the direction orthogonal to the top surfaces of the layers (vertical direction in FIG. 2j). The CMUT 100 further comprises a conductive portion 56 for providing an external electrical connection from the via 55 (e.g. to an ASIC and/or a power supply, e.g. to connect to a bias voltage, or connections to a cable or wire bonds). Also, the CMUT 100 comprises the conductive via 15 from the first electrode 10. The conductive via 15 is formed in the substrate 1. The via 15, 55 extends in a vertical direction (orthogonal to the top surface(s) of the layers or the substrate) and the conductive portion 56 extends in a horizontal direction (parallel to the top surfaces(s) of the layers or the substrate).

FIG. 3a-h show a method of manufacturing a CMUT according to a third embodiment. The method of the third embodiment of FIG. 3a-h is similar to the method of the second embodiment of FIG. 2a-j. However, compared to the second embodiment, the step of FIG. 2c of separately patterning the second electrode layer 50 is omitted. Therefore, in the third embodiment less etching masks are used.

Also in this third embodiment, a substrate 1 comprises an ASIC 2 integrated therein and a conductive via 15 in the substrate 1. The method starts with depositing a first electrode layer 10 on the substrate 1. Then, a first dielectric film 20 is deposited on the first electrode layer 10, and a sacrificial layer 30 is deposited on the first dielectric film 20. The sacrificial layer 30 is removable for forming a cavity of the transducer later on. Subsequently, a second dielectric film 40 is deposited on the sacrificial layer 30. Then, a second electrode layer 50 is deposited on the second dielectric film 40. Each of these depositing steps is performed by Atomic Layer Deposition (ALD). In this way a stack of alternating layers of a dielectric material and a conductive material are provided (see FIG. 3a). Thus, all CMUT functional layers (AL-ALD CMUT) are deposited in one single process sequence.

The method further comprises patterning all of the deposited layers and films 10, 20, 30, 40, 50, in particular all of the deposited CMUT functional layer 10, 20, 30, 40, 50. In this embodiment, patterning comprises a common step of patterning the second electrode layer 50, the sacrificial layer 30, and the first electrode layer 10 (see FIG. 3b). Thus, in this embodiment all of the deposited layers (second electrode layer 50, second dielectric isolation layer 40, sacrificial layer 30, first dielectric isolation layer 20, and first electrode layer 10) are patterned in a common step. As can be seen, all the deposited layers and films 10, 20, 30, 40, 50 have the same lateral dimension (in a direction parallel to the top surface(s) of the layers or substrate), for example diameter in the case of a circular shape. The common patterning step can be performed using a first etching mask (mask 1). Now, the step of patterning is finished.

Figure 3A:
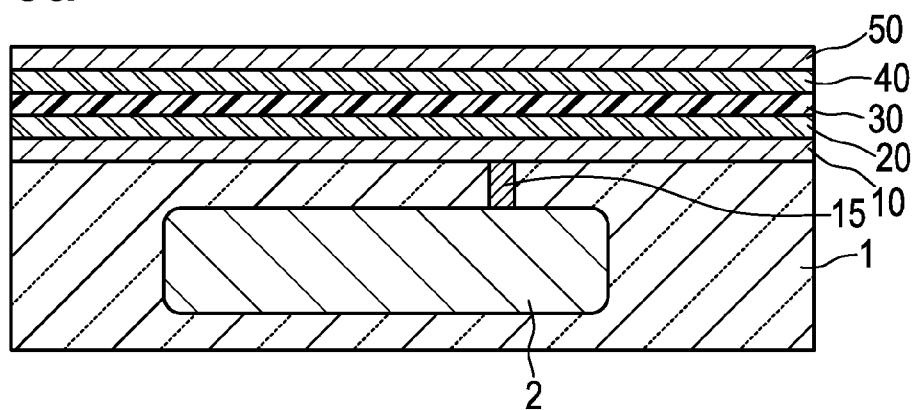
FIG. 3a-h show a method of manufacturing a CMUT according to a third embodiment.
Figure 3B:
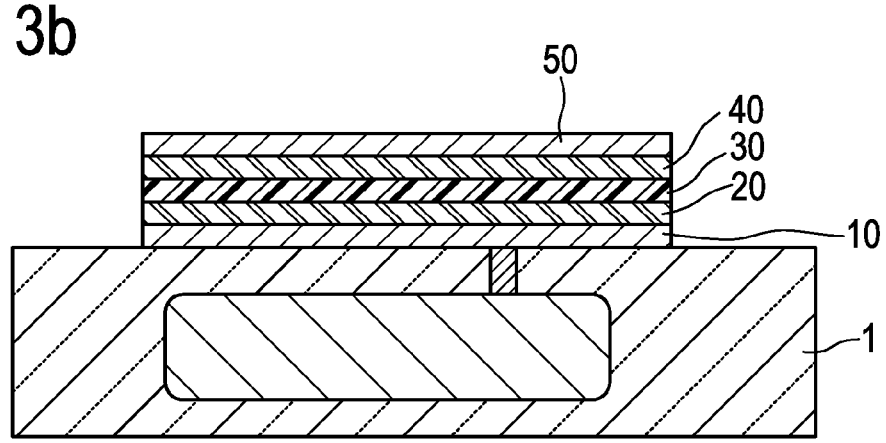
Figure 3C:
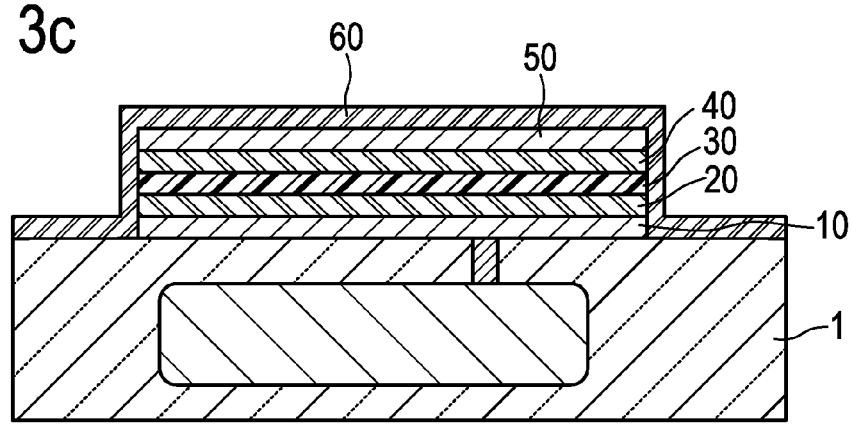

In a subsequent step, referring now to FIG. 3c, the method comprises depositing a dielectric layer 60 covering the deposited layers and films 10, 20, 30, 40, 50. This depositing step is again performed using Atomic Layer Deposition (ALD). The dielectric layer 60 covers the top surfaces and side surfaces of the deposited layers and films 10, 20, 30, 40, 50 with essentially the same coverage. In this way, a very good step coverage is provided. In other words, the vertical portions of the dielectric layer 60 and the horizontal portions of the dielectric layer 60 have about the same coverage or thickness (see FIG. 3c).

Figure 3D:
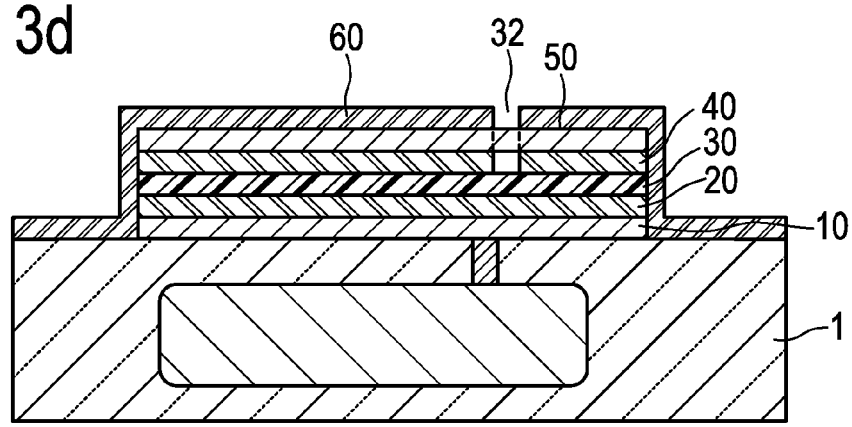
Figure 3E:
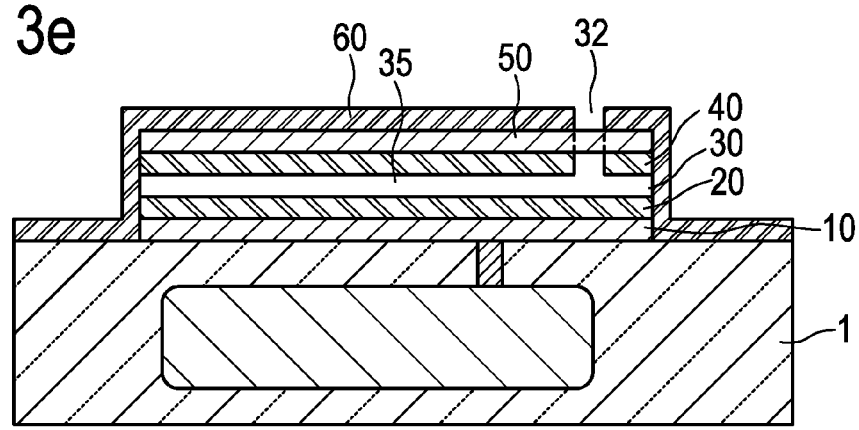
Figure 3F:
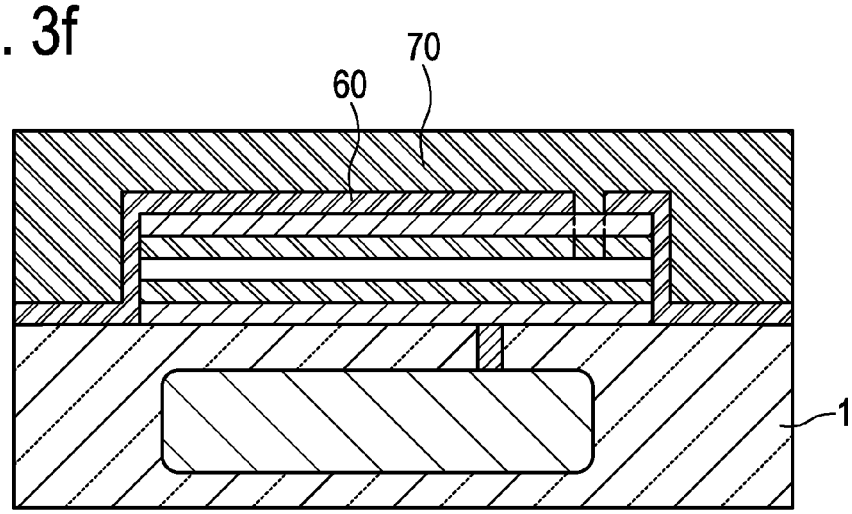
Figure 3G:
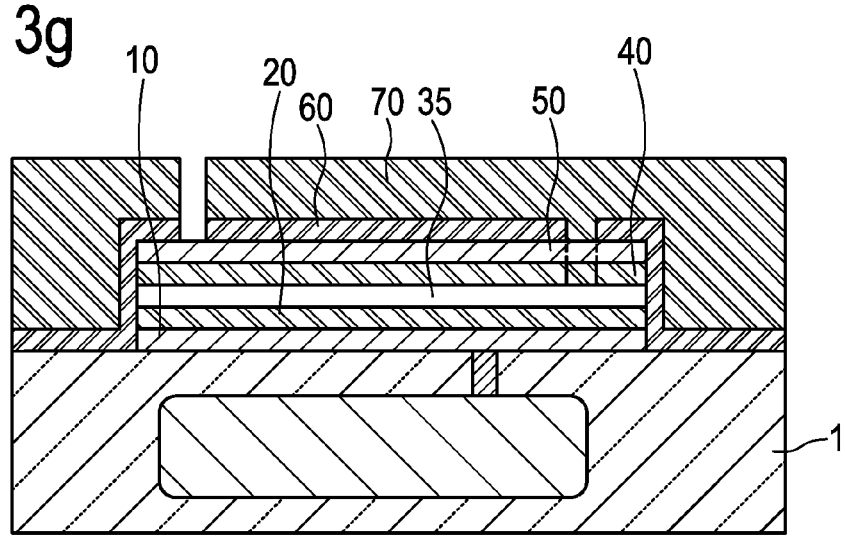

Subsequently, the method comprises removing the sacrificial layer 30 by providing an etch hole 32 (see FIG. 3d) and etching the sacrificial layer 30 for forming the cavity 35 (see FIG. 3e). The etch hole 32 is provided in the dielectric layer 60 and the second dielectric isolation film 40. As indicated in FIG. 3d and FIG. 3e, the etch hole 32 is preferably not provided in the second electrode layer 50, but somewhere next to it. As indicated by the dashed lines in FIG. 3d and FIG. 3e, the etch hole 32 extends from the dielectric layer 60, past the second electrode layer 50, to the second dielectric film 40. The etch hole 32 can be provided using a second etching mask (mask 2). Then, referring to FIG. 3f, an additional layer 70, in particular an additional dielectric layer, can be provided covering the dielectric layer 60. The additional layer 70 closes or seals the etch hole 32.

Further, the method comprises providing a conductive via 55 extending from the second electrode layer 50 in a direction orthogonal to the top surfaces of the layers. Thus, the conductive via 55 is orthogonal or at a right angle to the deposited layers. In this example, this is performed by providing an etch hole 62 (see FIG. 3g) and filling the etch hole 62 with a conductive material for forming the conductive via 55 (see FIG. 3h). Providing the etch hole 62 can be performed using a third etching mask (mask 3). The conductive via 15 to the first electrode 10 is formed in the substrate 1. Further, a conductive portion 56 for providing an external electrical connection from the via 55 is provided. This can be performed by depositing a conductive layer on the additional layer 70 and then patterning the conductive layer. This can be performed using a fourth etching mask (mask 4).

Figure 3H:
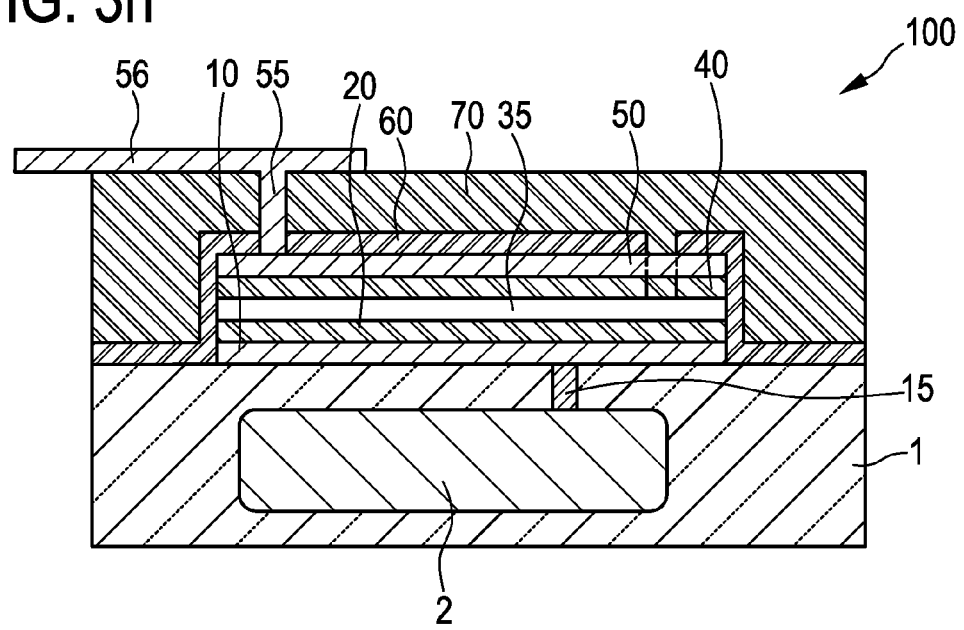

FIG. 3h shows a schematic cross section of a CMUT 100 according to a third embodiment. The CMUT 100 of FIG. 3h has in particular been manufactured using the method as described above with reference to FIG. 3. The CMUT 100 comprises the first electrode layer 10 on the substrate 1, the first dielectric film 20 on the first electrode layer 10, the cavity 35 formed above the first dielectric film 20, the second dielectric film 30 covering the cavity 35, and the second electrode layer 50 on the second dielectric film 40. Optionally, the CMUT 100 may comprise a dielectric layer 11 on the substrate and a dielectric layer 51 on the second electrode layer 50, as explained with reference to the first embodiment. In the embodiment shown in FIG. 3h, all of the deposited CMUT functional layers and films 10, 20, 30, 40, 50 are patterned in a common step. Thus, all of the deposited layers and films 10, 20, 30, 40, 50 are patterned to have the same lateral dimension (in a direction parallel to the top surface(s) of the layers or substrate), for example diameter in the case of a circular shape. Thus, in this embodiment no characteristic (step) pyramid structure is provided. The CMUT 100 further comprises the dielectric layer 60 covering the deposited layers and films 10, 20, 30, 40, 50. The dielectric layer 60 covers the top surfaces and side surfaces of the deposited layers and films 10, 20, 30, 40, 50 with essentially the same coverage, as explained above. The vertical portions of the dielectric layer 60 extend substantially orthogonal to the deposited layers 10, 20, 30, 40, 50. The CMUT 100 further comprises the additional layer 70 covering the dielectric layer 60. In particular, the additional layer 70 is much thicker compared to the other layers or films, for example more than 2 times or more, or more than 5 times or more (e.g. a thickness of layer 40 of about 200 nm compared to a thickness of layer 70 of about 1 μm). It should be noted that in FIG. 3h, the additional layer 70 is indicated only schematically, and that it can rather follow the shape of layer 60, similarly to the additional layer 70 illustrated with respect to FIG. 1j. Furthermore, the CMUT comprises the conductive via 55 extending from the second electrode layer 50 in the direction orthogonal to the top surfaces of the layers (vertical direction in FIG. 3h). The CMUT 100 further comprises a conductive portion 56 for providing an external electrical connection from the via 55 (e.g. to an ASIC and/or a power supply, e.g. to connect to a bias voltage, or connections to a cable or wire bonds). Also, the CMUT 100 comprises the conductive via 15 from the first electrode 10.

The conductive via 15 is formed in the substrate 1. The via 15, 55 extends in a vertical direction (orthogonal to the top surface(s) of the layers or the substrate) and the conductive portion extends in a horizontal direction (parallel to the top surfaces(s) of the layers or the substrate).

In any of the shown embodiments, each of the first dielectric film 20 and the second dielectric film 40 comprises a first layer comprising an oxide, a second layer comprising a high-k material, and a third layer comprising an oxide. Thus, the dielectric isolation layer 20, 40 comprises an oxide layer (O), a high-k layer, and another oxide layer (0). In other words, a high-k layer is sandwiched between two oxide layers (in particular silicone oxide). In particular, the high-k material can be Aluminium Oxide ($Al_2O_3$) and/or Hafnium Oxide ($HfO_2$). For example, a laminate (alternating layers) of Oxide—Aluminium Oxide—Oxide (abbreviated by OAO) can be provided. In another example, the second layer comprises a first sublayer comprising Aluminium Oxide, a second sublayer comprising Hafnium Oxide, and a third sublayer comprising Aluminium Oxide. In this way, a laminate (alternating layers) of Oxide—Aluminium Oxide—Hafnium Oxide—Aluminium Oxide—Oxide (abbreviated by OAHAO) can be provided.

The dielectric constant of the deposited layer generally depends on the density of the material, and thus the deposition or processing settings, such as the processing temperature (temperature at which the layer is formed). Aluminium Oxide has a dielectric constant (k or $\in_r$) between 7 and 9, depending on the deposition or processing settings. For example, the dielectric constant of Aluminium Oxide can be 7.5 (e.g. deposited at a low temperature of about 265° C.), or 8 (e.g. deposited at a high temperature of about 350° C.), or 9. Hafnium Oxide has a dielectric constant (k or $\in_r$) between 12 and 27, depending on the deposition or processing settings. For example, the dielectric constant of Hafnium Oxide can be 14, or 20, or 25. The dielectric constant of the laminate of Aluminium Oxide—Hafnium Oxide—Aluminium Oxide can for example be 10.

Preferably, in each of the shown embodiments, each of the first electrode layer 10 and the second electrode layer 50 comprises a non-metal conductive material (e.g. a semiconductor). For example, the non-metal conductive material can be at least one (or exactly one) material selected from the group comprising TiN (Titanium Nitride), TaN (Tantalum Nitride), TaCN, $IrO_2$ (Iridium Oxide), ITO (Indium Tin Oxide), $LaNiO_3$, and $SrRuO_3$ (Strontium Ruthenate). These materials are suitable for Atomic Layer Deposition. In particular, the non-metal conductive material can be Titanium Nitride (TiN). Titanium Nitride (TiN) has a conductivity of about 30 to 70 μΩcm, which is considered to be a good conductor. Also, polysilicon can be used (having a conductivity in the order of 500 μΩcm). It will be understood that the material of the electrode layer can also be any other conductive material, such as for example a metal, in particular comprising at least one (or exactly one) material selected from the group comprising Ni (Nickel), Copper (Cu), W (Tungsten), Pt (Platinum), Ir (Iridium), and Al (Aluminium). For example, the metal can be an alloy thereof. For example, Aluminium has a conductivity in the order of 3 μΩcm. In any case, the conductive material of the electrode, metal and non-metal, has to be suitable to be deposited by ALD (e.g. in an ALD-machine).

The dielectric layer 60 and/or the additional layer 70 can for example be or comprise oxide (in particular silicon oxide), nitride (in particular silicon nitride), or a combination of both. For example, the dielectric layer 60 can be or comprise a combination of (silicon) oxide and (silicon)

nitride. For example, the additional layer 70 can be or comprise (silicon) nitride. However, it will be understood that any other suitable dielectric material can be used. The dielectric layer 60 can for example be deposited by ALD or by PECVD. The additional layer 70 can in particular be deposited by PECVD, due to its higher thickness. In particular, the sacrificial layer 30 is made of a different material (having different etching properties) as the dielectric isolation layers 20, 40. In this way, the sacrificial layer can be removed selectively.

Figure 4:
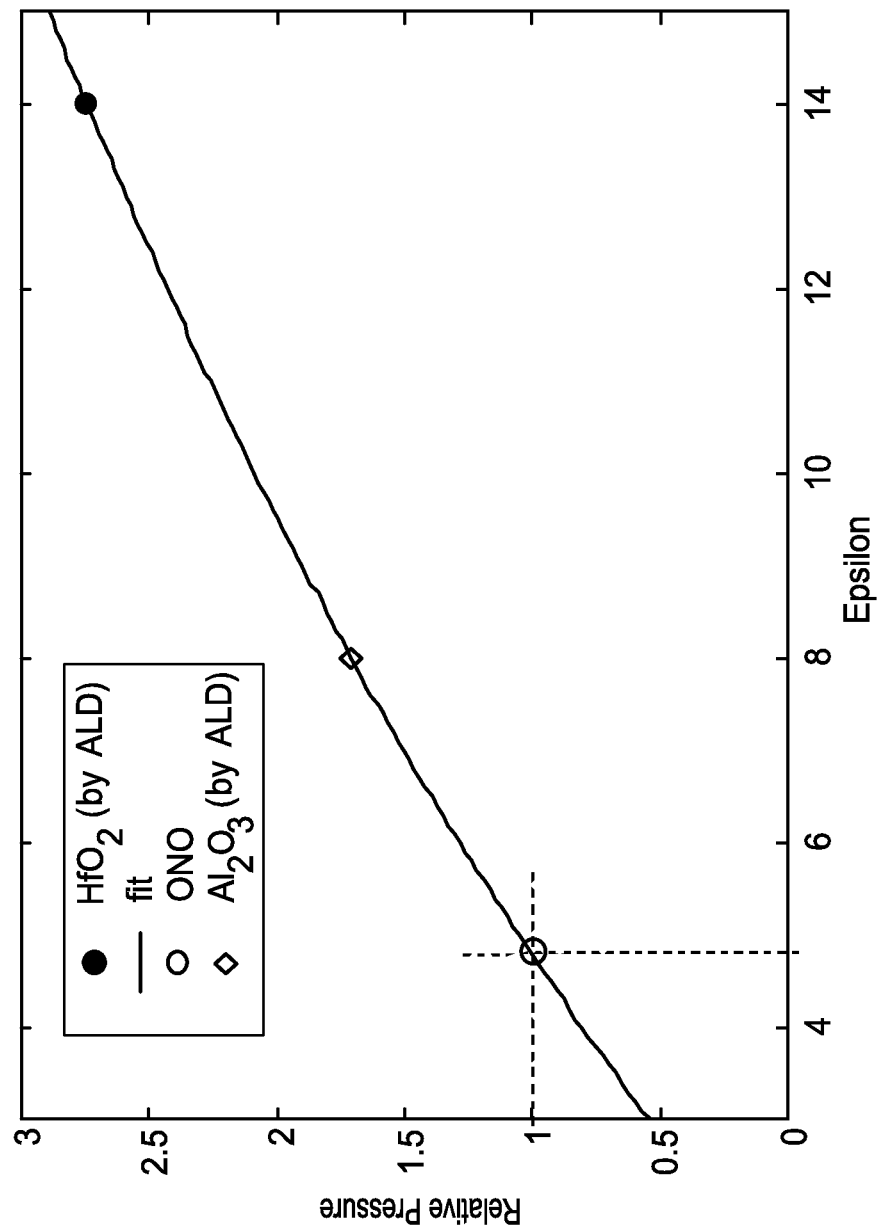
FIG. 4 shows a diagram of a dielectric constant (epsilon) versus relative acoustic output pressure of a CMUT.

FIG. 4 shows a diagram of a dielectric constant (epsilon) versus relative acoustic output pressure of a CMUT. FIG. 4 is based on a simulation. All dimensions (gap thickness, dielectric thickness, etc.) are assumed to be constant. The closed circle indicates Hafnium Oxide ($HfO_2$) deposited by ALD (here with an epsilon of 14). The open circle indicates ONO. The diamond indicates Aluminium Oxide ($Al_2O_3$) deposited by ALD (here with an epsilon of 8). As can be seen, high-k materials almost double the output pressure (e.g. about 70% for $Al_2O_3$), provided the bias voltage can be applied.

Figure 5:
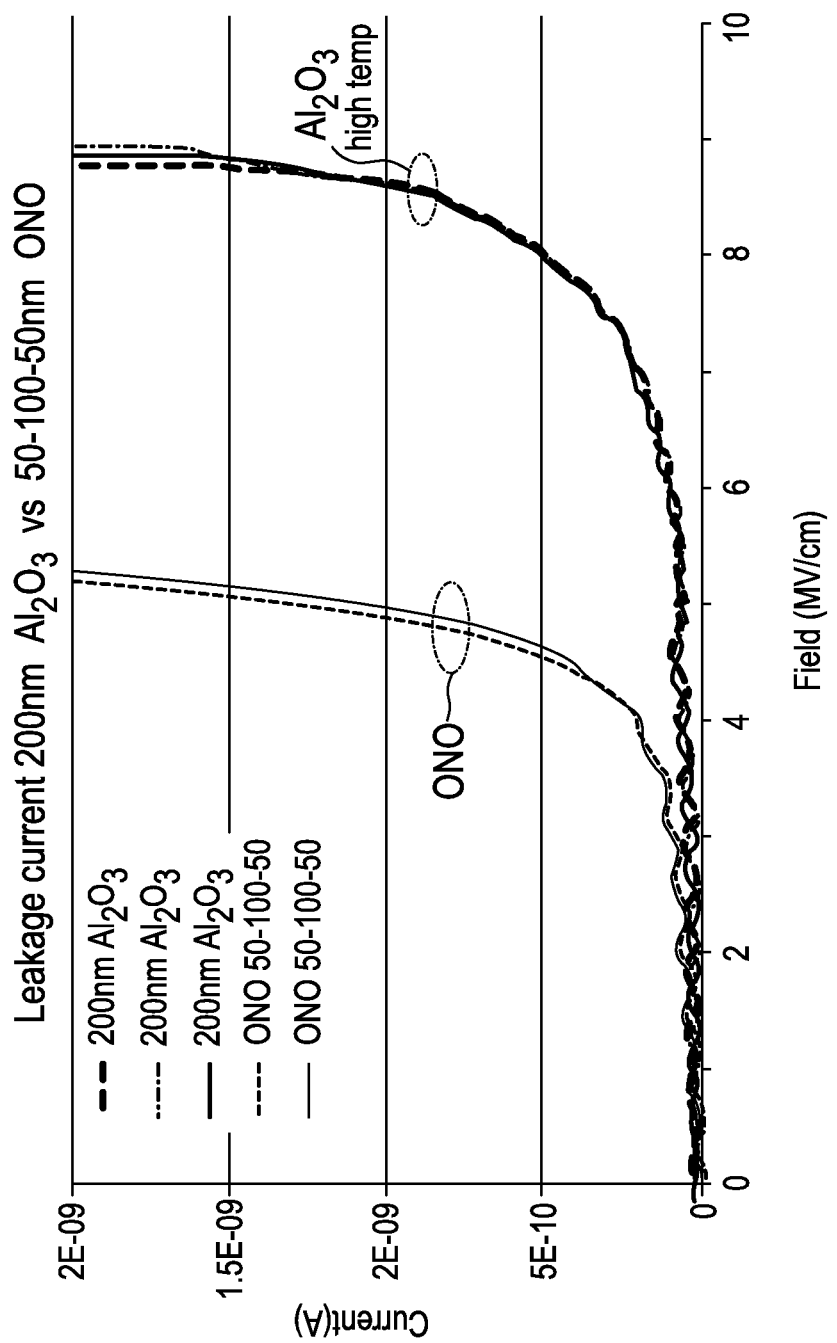
FIG. 5 shows an exemplary graph of the electrical field across the dielectric versus current flowing through the dielectric.

FIG. 5 shows an exemplary graph of the electrical field across the dielectric versus current flowing through the dielectric. Graphs of the field versus current are shown for each of ONO and Aluminium Oxide $Al_2O_3$ at high temperature. As can be seen in FIG. 8, for the same field value, Aluminium Oxide $Al_2O_3$ (at high temperature) has less leakage current, compared to ONO. Also, for Aluminium Oxide $Al_2O_3$ (at high temperature) at least the same bias voltage can be applied compared to ONO.

It has been shown that to provide high-k dielectric layers and layer stacks manufactured using the Atomic Layer Deposition (ALD) technique improves the performance of the CMUT significantly (e.g. by lowering the operating voltage and/or increasing the (acoustic) output pressure). In particular, by providing non-metal electrodes (e.g. TiN), instead of metal electrodes, the ALD technique provides the unique option to deposit all CMUT functional layers during one single process step. Thus, dielectric stacks with a higher effective dielectric constant provide performance improvement that should be combined with similar or lower drift of the CMUT due to charge trapping in the dielectric layers. The All Layer ALD (AL-ALD) CMUT process is very beneficial because it offers options to further improve the CMUT performance by tuning the properties of the individual layers and their interfaces. The AL-ALD technique with top-to-bottom patterning ensures high quality interfaces of the various dielectrics and requires less operator intervention.

In a CMUT it can be detected if a layer has been deposited by ALD, in one example, if deposited by ALD, the first dielectric film 20 and/or the second dielectric film 40 comprises process residuals, such as Carbon or Chlorine residuals. The residuals can for example be detected using XPS (X-ray photoelectron spectroscopy) or other characterization methods, such as SIMS (Secondary Ion Mass spectroscopy). In another example, the second layer of the dielectric isolation layer 20, 40 has a thickness below 100 nm. Such a very thin high-k layer can (only) be provided using ALD.

In the method described herein (AL-ALD), first almost the entire stack of layers is deposited first and then patterned (and finally a dielectric layer is deposited that also seals the cavity). Thus, for a CMUT produced by this method, in the cross-section of the CMUT in a region next to the membrane all or most of the dielectric layers are removed or not present. However, for a CMUT produced by another method (not ALD), e.g. using sputtering, in the cross-section of the CMUT in a region next to a membrane all or most of the dielectric layers that make up the CMUT are present.

A layer (in particular of $Al_2O_3$ and/or $HfO_2$) deposited by ALD can exhibit one or more of the following features:

(1) The step coverage of ALD deposited $Al_2O_3$ is very good and very conformal, e.g. in contrast to sputtered $Al_2O_3$. This is detectable in a (cross section) SEM for example.

(2) The ALD-oxides allow better control of charging effects and leakage currents are much lower (as they are pinhole free), which shows up in a capacitive—voltage—measurement (CV-curve).

(3) The composition of $Al_2O_3$ is different (e.g. compared to sputtered $Al_2O_3$) and can be detected by RBS and/or XPS.

(4) Typical process residuals such as Carbon (which cannot be found in e.g. sputtered $Al_2O_3$), detected by XPS or SIMS.

Just as an example, SIMS (Secondary Ion Mass spectroscopy) can be used to detect the differences between sputtered Aluminum-Oxide and Aluminum-Oxide deposited by ALD. For example, in a sputtering process Argon is used and some remainders are found in the sputtered layer (e.g. a few percent). This can be easily detected by SIMS (Secondary Ion Mass spectroscopy).

The functionality of the oxide layer (O) in an OAO dielectric isolation layer is very different, compared to the oxide layer (O) in an ONO dielectric isolation layer. The oxide layer (O) in an ONO dielectric isolation layer is there for electrical reasons. Without the oxide layer (O), there would be a significant electrical charging of the CMUT device that seriously degrades the performance. In practice the minimum thickness of a single O-layer (deposited by PECVD) is about 50 nm. The oxide layer (O) in an ONO dielectric isolation layer is there for processing reasons. It was found that without the oxide layer (i.e. an Alumina-layer only), the layer suffers from very large mechanical stress resulting is an extreme membrane deformation and the CMUT device is not operable. However, using an OAO dielectric isolation layer provides a low stress level. The oxide layer can be thin. Further, an OAO dielectric isolation layer has an even better electrical behaviour compared to an Alumina-layer only.

The capacitive micro-machined transducer has been described as a CMUT, involving ultrasound. However, it shall be understood that the capacitive micro-machined transducer can also be used for other applications, for example as a pressure sensor or pressure transducer.

The capacitive micro-machined transducer, in particular CMUT, can comprise or be a single cell, in particular CMUT cell. However, it will be understood that the capacitive micro-machined transducer, in particular CMUT, can also comprise a plurality or an array of cells, in particular CMUT cells. The capacitive micro-machined transducer, in particular CMUT, and/or its layers can have a circular shape. However, also other shapes can be used, such as a square or a hexagonal shape.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an"

does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A capacitive micromachined ultrasound transducer, comprising:
    a first electrode layer on a substrate, wherein the first electrode layer comprises a first non-metal conductive material;
    a first dielectric layer on the first electrode layer, wherein the first dielectric layer comprises a first layer comprising an oxide, a second layer comprising an oxide, and a high-k material layer having a high dielectric constant, wherein the high-k material layer is sandwiched between the first oxide layer and the second oxide layer, and wherein the first dielectric layer comprises a residual from atomic layer deposition;
    a membrane above the first dielectric layer, wherein a cavity is formed between the first dielectric layer and the membrane; and
    a second electrode layer formed on the membrane, wherein the second electrode layer comprises a second non-metal conductive material, and wherein the transducer is configured to be coupled to a voltage source that is configured to apply a voltage such that during operation the transducer is in a collapsed mode.

2. The capacitive micromachined ultrasound transducer of claim 1, wherein the high dielectric constant is between 8 and 9 or between 12 and 27.

3. The capacitive micromachined ultrasound transducer of claim 1, wherein the high-k material layer having the high dielectric constant comprises Aluminum Oxide or Hafnium Oxide.

4. The capacitive micromachined ultrasound transducer of claim 1, wherein the membrane comprises a second dielectric layer, wherein the second dielectric layer includes another layer having a high dielectric constant sandwiched between first and second layers comprising an oxide.

5. The capacitive micromachined ultrasound transducer of claim 1, wherein the first dielectric layer has a thickness of less than 100 nm.

6. The capacitive micromachined ultrasound transducer of claim 1, wherein the layer having a high dielectric constant has a thickness of less than 100 nm.

7. The capacitive micromachined ultrasound transducer of claim 1, wherein the residual from atomic layer deposition comprises carbon or chlorine.

8. The capacitive micromachined ultrasound transducer of claim 1, having a circular, square or hexagonal shape.

9. The capacitive micromachined ultrasound transducer of claim 1, comprising a single cell.

10. The capacitive micromachined ultrasound transducer of claim 1, comprising an array of cells.

11. The capacitive micromachined ultrasound transducer of claim 1, wherein at least one of the first non-metal conductive material and the second non-metal conductive material includes at least one of titanium nitride, tantalum nitride, iridium oxide, indium tin oxide, strontium ruthenate, TaCN, and $LaNiO_3$.

12. The capacitive micromachined ultrasound transducer of claim 1, wherein at least one of the first non-metal conductive material and the second non-metal conductive material includes polysilicon.

* * * * *